United States Patent
Silvano De Sousa

(10) Patent No.: US 10,945,332 B2
(45) Date of Patent: Mar. 9, 2021

(54) HEAT CAPACITIVE COMPONENT CARRIER AND METHOD TO PRODUCE SAID COMPONENT CARRIER

(71) Applicant: AT&S Austria Technologie & Systemtechnik Aktiengesellschaft, Leoben (AT)

(72) Inventor: Jonathan Silvano De Sousa, Vienna (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 16/097,071

(22) PCT Filed: Apr. 27, 2017

(86) PCT No.: PCT/EP2017/060071
§ 371 (c)(1),
(2) Date: Oct. 26, 2018

(87) PCT Pub. No.: WO2017/186856
PCT Pub. Date: Nov. 2, 2017

(65) Prior Publication Data
US 2019/0110356 A1 Apr. 11, 2019

(30) Foreign Application Priority Data
Apr. 27, 2016 (EP) .................... 16167266

(51) Int. Cl.
*H05K 1/02* (2006.01)
*F28D 20/02* (2006.01)
(Continued)

(52) U.S. Cl.
CPC ....... *H05K 1/0206* (2013.01); *F28D 15/0233* (2013.01); *F28D 20/023* (2013.01);
(Continued)

(58) Field of Classification Search
CPC ...... H05K 1/0206; H05K 3/4038; H05K 3/22; H01L 23/427; H01L 23/38; H01L 21/4846; F28D 20/023
(Continued)

(56) References Cited

U.S. PATENT DOCUMENTS

| 5,007,478 A | 4/1991 | Sengupta |
| 5,270,550 A | 12/1993 | Martorana et al. |

(Continued)

FOREIGN PATENT DOCUMENTS

| EP | 0732743 A2 | 9/1996 |
| WO | 2004109798 A1 | 12/2004 |

(Continued)

OTHER PUBLICATIONS

Extended European Search Report for European Application No. 16167266.2, Search completed Oct. 14, 2016, dated Oct. 24, 2016, 2 Pgs.

(Continued)

*Primary Examiner* — Tremesha S Willis
(74) *Attorney, Agent, or Firm* — KPPB LLP

(57) ABSTRACT

The invention refers to a component carrier realized as a printed circuit board, an intermediate printed circuit board product or an IC-substrate, comprising at least one heat-passage component, said at least one heat-passage component being realized in form of a heat-generating or a heat-absorbing component that is mounted on an outside surface layer or is embedded within at least one inner layer of the component carrier, and further comprising at least one
(Continued)

latent-heat storage unit with a phase-change material. The phase-change material is arranged within at least one cavity and integrated within a laminated build-up of the component carrier and is directly thermoconductively coupled with the at least one heat-passage component. The invention also refers to a method for producing said component carrier.

10 Claims, 8 Drawing Sheets

(51) Int. Cl.
*H01L 23/38* (2006.01)
*H01L 23/427* (2006.01)
*F28D 15/02* (2006.01)
*H01L 23/373* (2006.01)
*H01L 23/367* (2006.01)
*H01L 21/48* (2006.01)
*H05K 3/22* (2006.01)
*H05K 3/40* (2006.01)

(52) U.S. Cl.
CPC ...... *H01L 21/4846* (2013.01); *H01L 23/3677* (2013.01); *H01L 23/3736* (2013.01); *H01L 23/38* (2013.01); *H01L 23/427* (2013.01); *H05K 1/0203* (2013.01); *H05K 3/22* (2013.01); *H05K 3/4038* (2013.01); *H05K 2201/064* (2013.01); *H05K 2201/10219* (2013.01); *Y02E 60/14* (2013.01)

(58) Field of Classification Search
USPC .......................................................... 174/252
See application file for complete search history.

(56) References Cited

U.S. PATENT DOCUMENTS

2006/0088271 A1    4/2006    Ghoshal
2010/0071882 A1    3/2010    Zhang et al.
2014/0054077 A1    2/2014    Minamio et al.

FOREIGN PATENT DOCUMENTS

WO    2005036587 A2    4/2005
WO    2017186856 A1    11/2017

OTHER PUBLICATIONS

International Preliminary Report on Patentability for International Application No. PCT/EP2017/060071, Report dated Oct. 30, 2018, dated Nov. 8, 2018, 8 Pgs.
International Search Report for International Application No. PCT/EP2017/060071, Search completed Jul. 7, 2017, dated Jul. 18, 2017, 3 Pgs.
Written Opinion for International Application No. PCT/EP2017/060071, Search completed Jul. 7, 2017, dated Jul. 18, 2017, 7 Pgs.

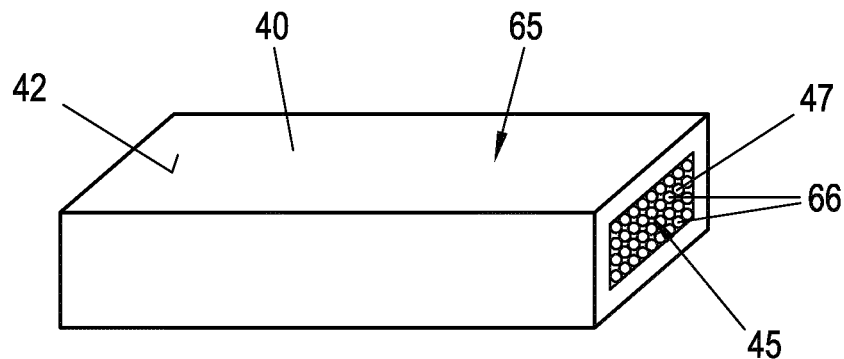
Fig. 8A
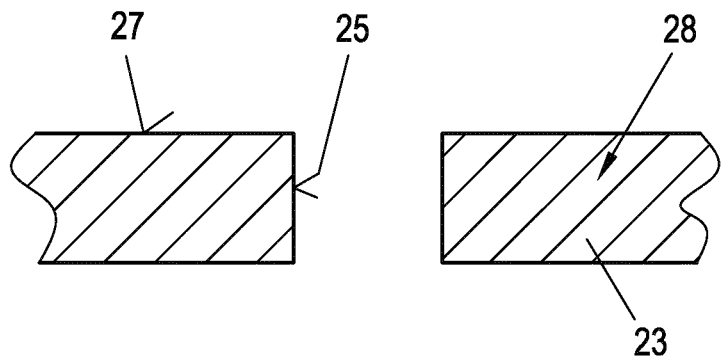
Fig. 8B
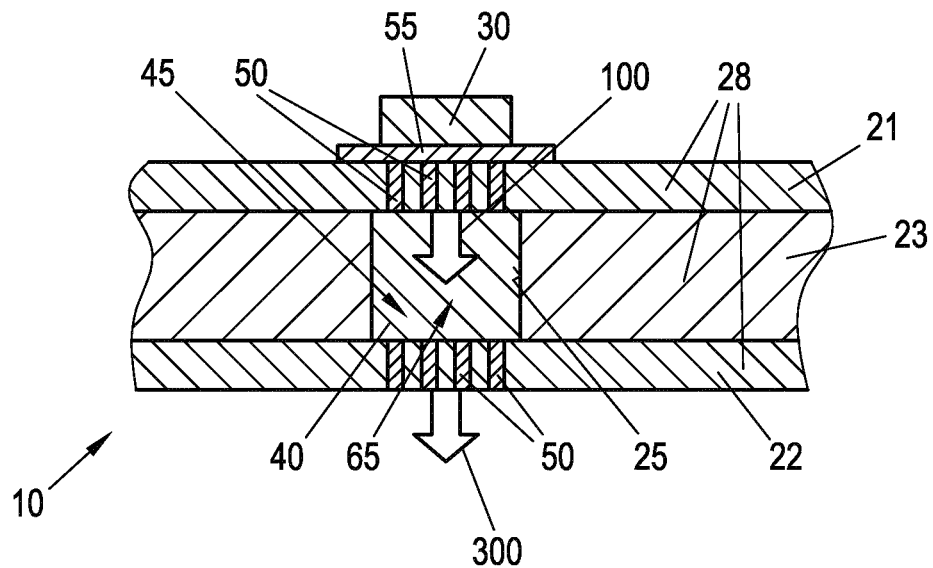
Fig. 8C
Fig. 8

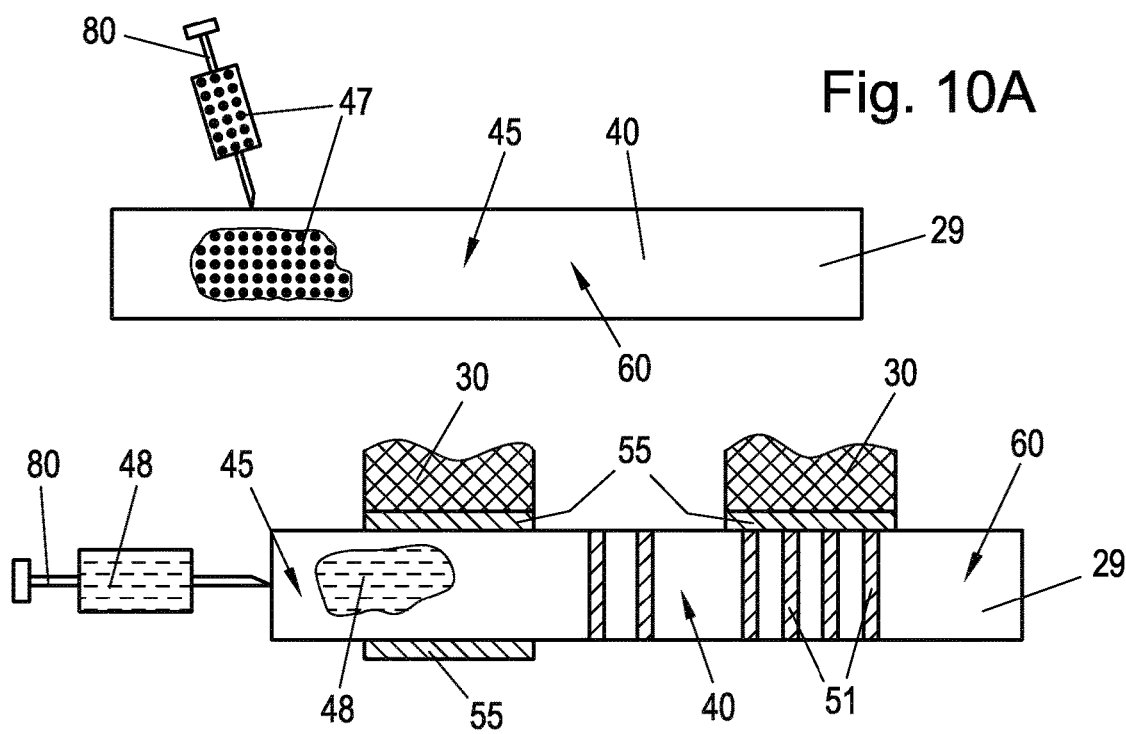
Fig. 10A
Fig. 10B
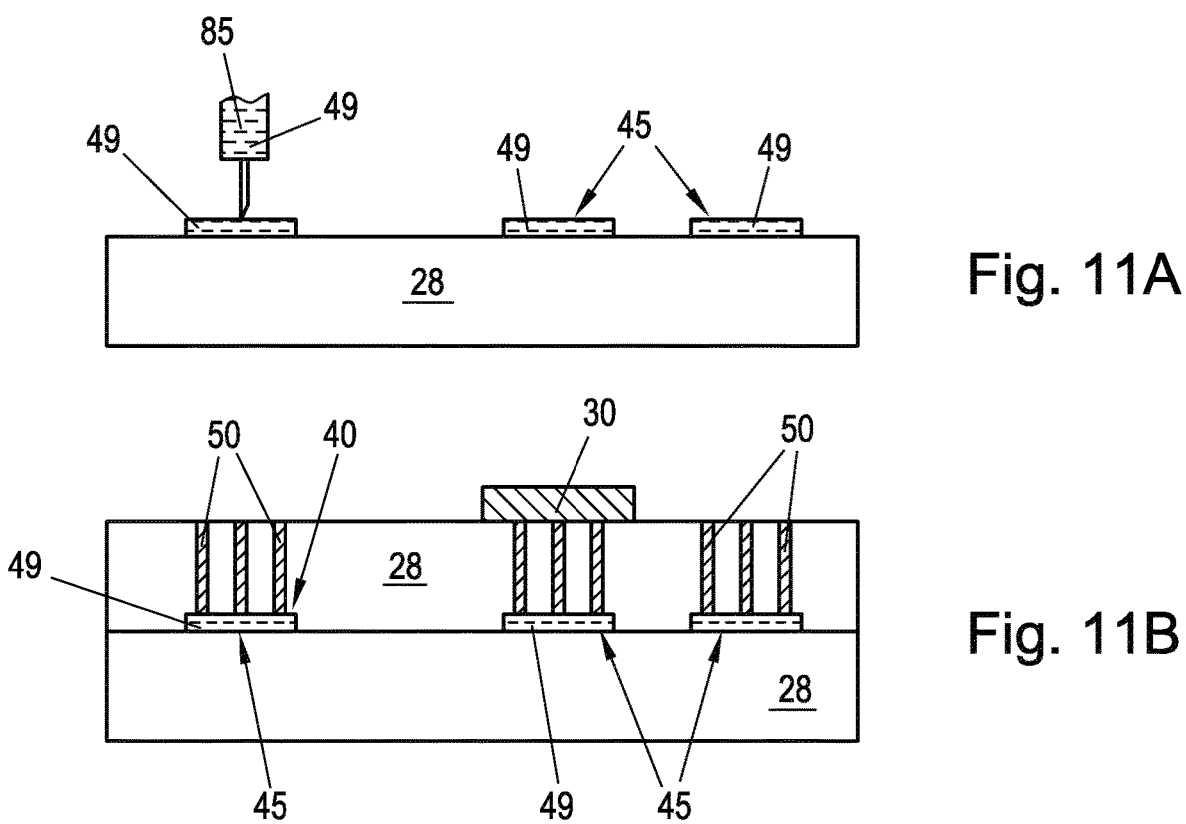
Fig. 11A
Fig. 11B

HEAT CAPACITIVE COMPONENT CARRIER AND METHOD TO PRODUCE SAID COMPONENT CARRIER

CROSS REFERENCE TO RELATED APPLICATIONS

This application is a U.S. National Stage of PCT Application No. PCT/EP2017/060071 filed Apr. 27, 2017, which claims priority to European Application No. 16167266.2 filed Apr. 27, 2016, the disclosures of which are incorporated by reference herein in their entirety.

FIELD OF THE INVENTION

The present disclosure generally relates to component carriers such as printed circuit boards. More specifically the invention relates to systems and methods of a heat capacitive component carrier.

The invention refers to a component carrier, realized as a printed circuit board, an intermediate printed circuit board product or an IC-substrate, comprising at least one heat-passage component, said at least one heat-passage component being realized in form of a heat-generating or a heat-absorbing component that is mounted on an outside surface layer or is embedded within at least one inner layer of the component carrier, and further comprising at least one latent-heat storage unit with a phase-change material. The invention also relates to a method for producing said component carrier.

BACKGROUND OF THE INVENTION

A phase-change material (short: PCM) is a substance with a high heat of fusion that for example melts and solidifies at a certain temperature and is capable of storing and releasing relatively large amounts of energy. Heat is absorbed or released when the material changes from solid to liquid and vice versa. Thus, phase-change materials are latent heat storage (short: LHS) units. During phase changes the temperature of the PCM's thermodynamic system remains constant. This is also the case for phase-change materials where the phase change of vaporisation—thus the phase change liquid to vapour—has to be considered. Heat Pipes, for example, work based on liquid-vapour phase change.

Also of relevance are solid/solid phase-change materials: These are PCMs that undergo a solid/solid phase transition with the associated absorption and release of large amounts of heat. These materials change their crystalline structure from one lattice configuration to another at a fixed and well-defined temperature, and the transformation can involve latent heats comparable to the most effective solid/liquid PCMs. Such materials are useful because, unlike solid/liquid PCMs, they do not require nucleation to prevent supercoiling. Additionally, because it is a solid/solid phase change, besides a slight expansion or contraction during phase change there is no visible change in the appearance of the PCM. Furthermore, for solid/solid phase-change materials there are no problems associated with handling of liquids, like containment or potential leakage.

Usage of PCM materials in order to function as a heat reservoir or heat sink, respectively, for printed circuit boards for a limited time is commonly known in the art. Thus the heat dissipation ability of the basic device like a PCB can be enhanced. For example, documents EP 0 732 743 A2 and U.S. Pat. No. 5,007,478 B each refer to heat sinks comprising PCM materials that can be externally attached for example to a printed circuit board (short: PCB) to absorb and store off-heat for a certain length of time. However, such applications are not without their limitations and problems.

Document WO 2005/036587 A2 shows an electronic unit comprising a heat accumulator. In a first embodiment a layer of a PCM material is arranged outside of a printed circuit board (PCB) in a gap between the PCB and an external heat sink that is attached to the PCB via an adhesive film. Disadvantageously in this embodiment the PCM material is not integrated within the printed circuit board, but is arranged outside of the PCB for the heat transfer to the separate, external heat sink.

In another embodiment disclosed in WO 2005/036587 A2, the PCM material is filled in or is partly plugged in via an open slot into an open recess of the already finished printed circuit board. Disadvantageously the open recess has to be sealed afterwards to avoid leakage of the PCM material. Thus together with the PCM material also a certain amount of air or gas is trapped within the sealed recess volume. Another disadvantage of said embodiment has to be pointed out: When the open recess in the quasi-finished printed circuit board is later on in the assembly process filled with a PCM material, that will inevitably result in unwanted air gaps or air pockets between the PCM material and the PCB. Especially when PCM materials with a solid cover or solid housing, like ceramics or epoxy resin composites filled with PCM, are applied, unwanted air gaps between the solid PCM housing and the recess walls of the PCB will remain, and will influence negatively the thermal flow or heat transfer, respectively. Thus, also in this second embodiment of WO 2005/036587 A2 the PCM material is not integrated within the printed circuit board.

Also document WO 2004/109798 refers to an assembly for thermally protecting electronic units in an electronic device, wherein a PCM material is arranged in containers that are attached on top of a printed circuit board after heat-releasing electronic components have been surface-mounted on the PCB.

Further on document US 2006/0088271 A1 refers to a transient thermoelectric cooling (TEC) device as carrier for a heat producing photo emissive device. On the backside of the TEC device an external phase change material (PCM) module is attached like a heat sink. The PCM module is formed by etching pits in a substrate, filling the pits with the phase change material and encapsulating the phase change material by depositing a metal layer. Thus the PCM module, which is the etched metal substrate filled with PCM material, respectively, is attached on an outside of the TEC device and has heat sink functionality. The heat producing photo emissive device is not in direct contact with the PCM module, which is a significant disadvantage of this specific embodiment.

The aforementioned technical designs however have at least the drawback that the PCM material is not in direct thermal contact with hot spots of the heat-releasing components and/or structures, what is especially of disadvantageous when these components or structures are embedded within a multi-layered printed circuit board structure. Unfavourably, PCM material that is arranged in external layers outside of the PCB or in open recesses of the PCB but apart from said heat-releasing components and/or structures can store and dissipate off-heat only to a limited extent due to less thermal conduction or higher heat transfer resistance, respectively.

Document US 2014/0054077 A1 refers to a semiconductor device which is connected to a base substrate layer that contains an electrical insulating resin with a filler. The filler itself contains electrical insulating capsules that are filled with PCM material. As the base substrate is arranged layer-wise, this embodiment has at least the disadvantage that the micro-encapsulated PCM material is not in direct contact with the semiconductor device. Furthermore, the layer-wise arrangement of the base substrate layer has the drawback that manufacture of through-connections like copper vias is not possible. By drilling the base substrate layer, some of the encapsulated filler particles probably will be damaged and the encapsulated PCM material will be opened, what results in PCM spillage and undesired cavities within the drilling hole's walls. Besides the aforesaid disadvantages it also has to be pointed out that document US 2014/0054077 A1 refers to a semiconductor device. In contrary the present application refers to printed circuit boards, intermediate printed circuit boards or IC-substrates and issues related to their manufacture, which materials and processes differ significantly from those applied for semiconductor technology

SUMMARY OF THE INVENTION

The application is directed to systems and methods for a component carrier. Many embodiments are directed to a component carrier, realized as a printed circuit board, an intermediate printed circuit board product or an IC-substrate, that has at least one heat-passage component, where the heat-passage component has a heat-generating or a heat-absorbing component that is mounted on an outside surface layer or is embedded within an inner layer of the component carrier. The latent-heat storage unit may have a phase-change material wherein the phase-change material is arranged within at least one cavity and integrated within a laminated build-up of the component carrier and is directly thermoconductively coupled with the at least one heat-passage component.

In other embodiments, the phase-change material is thermoconductively coupled with the at least one heat-passage component by a means selected from a group consisting of at least one thermal via, plated through-hole and a heat pipe.

In still other embodiments, the phase-change material is a microencapsulated phase-change material, having a mean particle size of 1 µm to 50 µm.

In yet other embodiments, the phase-change material is selected from a group consisting of a microencapsulated phase-change material and a solid-solid phase change material, wherein the phase-change material has a mean particle size of 5 µm to 30 µm.

In still yet other embodiments, the phase-change material is encapsulated within cavities of a matrix material carrier that is integrated within the component carrier.

In other embodiments, the matrix material carrier is made of a metal matrix composite material.

In still other embodiments, the matrix material carrier is made of a woven matrix composite material.

In yet other embodiments, the component carrier also has at least one energy-harvesting element, wherein the at least one energy-harvesting element contains phase-change material that is directly thermoconductively coupled with the at least one heat-passage component.

In still yet other embodiments, the energy-harvesting element is a thermoelectric cooler or a thermoelectric generator.

In other embodiments, the phase-change material is in direct contact with the at least one heat-passage component.

Other embodiments include a method for producing a component carrier, that is realized as a printed circuit board, an intermediate printed circuit board product or an IC-substrate, with at least one heat-passage component being realized in form of a heat-generating or a heat-absorbing component, and at least one latent-heat storage unit with a phase-change material. The method may include the following steps:
   Providing a phase-change material;
   Optionally arranging the phase-change material as a latent-heat storage unit or embedding the phase-change material into a matrix material carrier;
   Providing at least one layer of the component carrier, preferably at least one inner layer;
   Manufacturing at least one cavity in said at least one layer;
   Embedding the phase-change material, which phase-change material is optionally already embedded within a matrix material carrier, within said at least one cavity of said at least one layer of the component carrier;
   Optionally embedding at least one heat-passage component within at least one layer of the component carrier or within the phase-change material;
   Arranging one or more further layers on the outsides of the at least one layer in a way to cover and surround the phase-change material;
   Laminating the layers together with the phase-change material to receive a first intermediate product;
   Optionally mounting at least one heat-passage component on an outside surface layer; and
   Thermoconductively coupling of the phase-change material with the at least one heat-passage component.

Other embodiments may include a method for producing a component carrier, realized as a printed circuit board, an intermediate printed circuit board product or an IC-substrate, with at least one heat-passage component being realized in form of a heat-generating or a heat-absorbing component, and at least one latent-heat storage unit with a phase-change material, where the method may include the following steps:
   Providing a phase-change material;
   Optionally arranging the phase-change material as a latent-heat storage unit or embedding the phase-change material into a matrix material carrier;
   Providing at least one layer of the component carrier, preferably at least one inner layer;
   Optionally manufacturing at least one cavity in the at least one layer;
   Arranging the phase-change material sectionally upon at least one section of a surface area of the at least one layer of the component carrier;
   Optionally embedding at least one heat-passage component within said at least one layer of the component carrier or within the phase-change material;
   Arranging one or more further layers on the outsides of the at least one layer in a way to cover and surround the phase-change material;
   Laminating the layers together with the phase-change material to receive a first intermediate product;
   Optionally mounting at least one heat-passage component on an outside surface layer; and
   Thermoconductively coupling of the phase-change material with the at least one heat-passage component.

In other embodiments, the phase-change material is directly thermoconductively coupled with the at least one heat-passage component by means selected from a group consisting of at least one thermal via, plated through-hole and heat pipe.

In still other embodiments, the phase-change material is arranged sectionally upon at least one section of a surface area of the at least one layer of the component carrier from a group consisting of a printing process, a silk-screen process, and is applied embedded within a layer of a woven matrix composite material.

In yet other embodiments, the phase-change material is embedded into a matrix material carrier, wherein the embedded into a matrix material carrier selected from a group consisting of a metal matrix composite material and a woven matrix composite material.

In still yet other embodiments, the phase-change material is selected from a group consisting of a microencapsulated phase-change material and a solid-solid phase-change material.

In other embodiments, at least one energy-harvesting element is integrated within the component carrier, wherein the at least one energy-harvesting element contains phase-change material that is directly thermoconductively coupled with the at least one heat-passage component.

BRIEF DESCRIPTION OF THE DRAWINGS

The description will be more fully understood with reference to the following figures, which are presented as exemplary embodiments of the invention and should not be construed as a complete recitation of the scope of the invention, wherein:

FIGS. 8A to 8C each refer in partially cross-sectional side views to a first method to produce a multi-layer component carrier with embedded phase-change material.

FIGS. 10A and 10B show in partially cross-sectional side views different methods to produce intermediates of a component carrier with integrated phase-change material.

FIGS. 11A and 11B each show in cross-sectional side views method steps to produce a component carrier with printed phase-change material.

DETAILED DESCRIPTION

Figure 1:
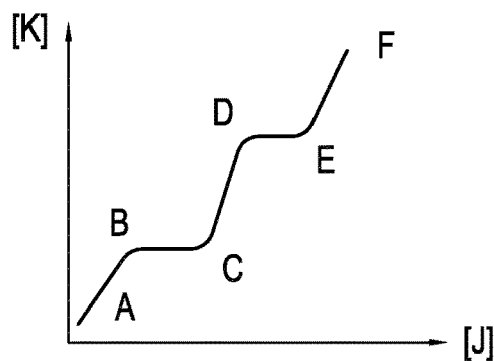
FIG. 1 refers to a diagram illustrating as a function of energy input versus temperature the phase changes of melting and vaporisation of a phase-change material.

Systems and methods for a component carrier are described. Many embodiments are directed to a component carrier, realized as a printed circuit board, an intermediate printed circuit board product or an IC-substrate, that has at least one heat-passage component, where the heat-passage component has a heat-generating or a heat-absorbing component that is mounted on an outside surface layer or is embedded within an inner layer of the component carrier. The latent-heat storage unit may have a phase-change material wherein the phase-change material is arranged within at least one cavity and integrated within a laminated build-up of the component carrier and is directly thermoconductively coupled with the at least one heat-passage component.

Thus, an object of the invention is to overcome the aforesaid disadvantages known in the art and to provide an improved component carrier like a PCB, an intermediate printed circuit board product or an IC-substrate, wherein at least one PCM material is arranged in a way within the component carrier that it is in direct thermal contact with the heat-releasing components and/or structures.

Another, more specific object of the present invention is to provide an improved component carrier, comprising at least one PCM material, wherein the heat dissipation capacity is enhanced and heat-generating components and/or heat-absorbing components are arranged in a way to ensure a proper thermal connection between the respective components and the PCM material.

Also, an aim of the invention is to indicate a component carrier, where heat sensitive components and/or devices mounted thereto or embedded within layers of the component carrier can be operated at relatively constant temperatures during a duty cycle. The improved component carrier shall be suitable especially for components or devices with high peak loads and low duty cycle such as power converters, electromechanical actuators, capacitors, processors and/or IGBT modules.

In this context the term "substrate" can be understood as carrier for electrical connections or electrical networks as well as component carrier comparable to a printed circuit board (PCB), however with a considerably higher density of laterally and/or vertically arranged connections. Lateral connections are for example conducting paths, whereas vertical connections might be for example drill holes. These lateral and/or vertical connections are arranged within the substrate and are commonly used to provide electrical and/or mechanical connections of components or surrounded components, particularly of IC chips, with a printed circuit board or intermediate printed circuit board. Thus, the term "substrate" also includes so-called "IC substrates".

Furthermore, the term "component" can be understood as electronic component or electronic chip, respectively. Each active electronic component like a chip, especially a semiconductor chip, or each passive electronic component like a condenser, a resistor, an inductor or a magnetic element like a ferrite core element, can be a component. Further examples for electronic components that can be embedded within or positioned upon a component carrier are data storage devices like a dynamic random access memory (DRAM), filters that can be configured for example as high-pass filter, low-pass filter or band-pass filter or that can be used as frequency filters. Also an integrated circuit (IC) like a so-called logic IC, any signal processing component like a microprocessor, any performance management component, any opto-electronic device, any voltage converter like DC/DC-converter or AC/DC-converter, any electromechanical converter like a lead-zirconium titanate (PZT)-sensor and/or actor, as well as any sender unit or receiving unit for electromagnetic waves like a RFID-chip or transponder, any cryptographic component, capacity, inductivity or switch like a transistor-based switch are comprised alone or combined with the aforementioned or together with other functional electronic components by the aforesaid term of a component or an electronic component, respectively. Furthermore, the electronic component can also comprise a microelectromechanical system (short MEMS), a battery, an accumulator, a camera or an antenna. However, also other electronic components may be embedded in the electronic device. For example, a magnetic element can be used as an electronic component. Such a magnetic element may be a permanent magnetic element like a ferromagnetic element, an antiferromagnetic element or a ferromagnetic element, for instance a ferrite core, or may be for example a paramagnetic element. Such an electronic component may be surface-mounted on the component carrier and/or may be embedded in an interior thereof.

Further, in this context of the present application, the term "heat-passage component" refers to a component like an aforesaid electronic component or to a structure that has heat-transferring or heat-dissipating properties, respectively. A heat-passage component can be for example a heat-generating electronic component that generates off-heat or waste-heat during its operation. A heat-passage component can also be a heat-absorbing component or structure that is suited for collecting energy from the environment or surroundings of said component carrier. Thus, a heat-passage component according to the present invention can be in terms of heat-balances quasi an "active" heat-generating or a "passive" heat-absorbing component or structure, respectively, whereby an "active" heat-passage component might be one that itself generates waste-heat whereas a "passive" heat-passage component might be one that collects and absorbs energy from the environment.

In addition, another task of the invention is to improve the heat management of a component carrier comprising a heat-passage component and a PCM material and to increase the heat absorption capability of the component carrier in regard to fast heat dissipation at constant temperatures.

A further object of the present invention is to provide a method for producing said component carrier with at least one heat-dissipating or heat-transferring component and at least one latent-heat storage unit with a phase-change material, wherein the heat dissipation capacity of said component carrier is enhanced.

The afore-mentioned objects are solved within the present invention by providing a component carrier according to the preamble of claim 1 with the features of the characterizing part of claim 1.

According to the invention a component carrier that is realized as a printed circuit board, as an intermediate printed circuit board product or as an IC-substrate, comprising at least one heat-passage component, wherein said at least one heat-passage component being realized in form of a heat generating or a heat-absorbing component that is mounted on an outside surface layer or is embedded within at least one inner layer of the component carrier, and that further comprises at least one latent-heat storage unit with a phase-change material, is arranged in a way that the phase-change material is arranged within at least one cavity and integrated within a laminated build-up of the component carrier and is directly thermoconductively coupled with the at least one heat-passage component.

Advantageously with a component carrier according to the invention off-heat that is generated by a heat-passage component during operation can reliably be conducted to the phase-change material that is laminated and integrated within the component carrier. The heat-passage component can be embedded within layers of the component carrier and/or can be surface-mounted.

Advantageously the phase-change material is arranged locally within one cavity or within several cavities that are always positioned next to a heat-passage component. Thus, usage of phase-change material can be optimised and can be arranged locally where it is required in a way that each heat-passage component can be directly thermoconductively coupled with the PCM material. This enhances also the design flexibility, as other regions of the component carrier without integrated PCM material are not affected by any assembly limitations due to the PCM materials applied.

Because the phase-change material is integrated via a lamination process within the component carrier, realized as printed circuit board, intermediate printed circuit board product or IC-substrate, respectively, unwanted air pockets or air bubbles can be avoided within the cavities that are filled with a certain PCM material. During the lamination process, when the layers together with the phase-change material are laminated to receive a first intermediate product, excess resin that is stored within the applied prepreg materials will bleed or leak out, respectively, of the surrounding prepreg layers into the cavity. By means of this excess resin intruding into the cavity, unwanted air bubbles and air pockets within the cavity between the PCM material are desorbed during lamination. Thus via the lamination step the PCM material is integrated within the at least one cavity, is also mechanically fixed via the excess epoxy resin, and in unison air bubbles are driven out of the cavities. This is a significant advantage, as in general air bubbles have to be avoided in manufacture of printed circuit boards or IC-substrates. Thermoconductivity of the PCM material is enhanced via laminating the PCB layers together with the phase-change material integrated within cavities between the layers. Advantageously also homogeneity of the component carrier is enhanced as air bubbles are driven out of the layer-wise build-up.

In case the heat-passage component is surface-mounted on an outside surface layer it may for example be carried out as one component or structure that collects and absorbs energy from the environment. In this embodiment heat from the environment or surroundings, respectively, of the component carrier is absorbed by the heat-passage component, collected by the PCM material and can be converted afterwards to supply for example energy to run an autonomous system. Thus, the component carrier can be used for example for energy harvesting applications to operate autonomous systems like autonomous sensor systems.

Thus with a component carrier according to the invention the integrated phase-change material can also be used to harvest energy from the environment. Furthermore, the phase-change material that is integrated within the component carrier can also shield or stabilize the temperature for temperature sensitive devices or components, respectively, that are embedded in or surface-mounted on said component carrier.

As phase-change material (short: PCM) materials with relatively low melting points for example in the range of −30° C. to 55° C. are used, that can absorb and release large amounts of heat. Most commonly salt hydrates, fatty acids and esters, and various paraffins are used as PCMs. Recently also some ionic liquids were found appropriate as PCMs. As most of the organic solutions are water-free, they can be exposed to air, but salt based PCM solutions must be encapsulated to prevent water evaporation or uptake. Both types—organic as well as salt based phase-change materials—offer certain advantages and disadvantages and if they are correctly applied some of the disadvantages becomes an advantage for certain applications. According the temperature range offered by the respective phase-change material also medium temperature energy storage applications can be realized.

Advantageously the component carrier according to the invention can comprise phase-change material that is thermoconductively coupled by means of at least one thermal via, plated through-hole and/or heat pipe, with the at least one heat-passage component.

Due to thermoconductive coupling with thermal vias, PTHs and/or heat pipes, heat transfer between heat-passage components or structures, respectively, and the PCM that is integrated within the component carrier is enhanced. Advantageously the latent-heat storage unit is designed like a cooling body for the phase-change material to dissipate the stored heat efficiently. For example, a metal structure made of copper or another highly thermoconductive metal can enclose the phase-change material which can be for example a microencapsulated phase-change material or a slurry of a PCM.

In a further preferred embodiment of the invention the component carrier can comprise phase-change material that is a microencapsulated phase-change material, preferably with a mean particle size of 1 to 50 micrometers, particularly preferably with a mean particle size of 5 to 30 micrometers. Additionally, or alternatively, the phase-change material applied can also be a solid-solid phase-change material.

Since phase-change materials transform between solid-liquid in thermal cycling, encapsulation is the obvious storage choice. If encapsulation of PCMs is made in large macro-scale, thermal conductivity is poor as PCMs tend to solidify at the edges of the storage containers preventing effective heat transfer. Thus, micro-encapsulation does not show these disadvantages and allows the PCMs also to be incorporated easily into construction materials with small dimensions. Micro-encapsulated PCMs also provide a portable heat storage system. By coating a microscopic sized PCM with a protective coating, the particles can be suspended within a continuous phase such as water. As capsule walls for example inert, stable polymers or plastic materials can be used. This system can be considered a phase change slurry (PCS).

Molecular-encapsulation is another technology, developed by Dupont de Nemours, that allows a very high concentration of PCM within a polymer compound. It allows for example storage capacities up to 515 kJ/m$^2$ for a 5 mm board (103 MJ/m$^3$). Advantageously molecular-encapsulation allows drilling and cutting through the material without any PCM leakage.

In another preferred embodiment, the component carrier according the invention can comprise phase-change material that is encapsulated within cavities of a matrix material carrier that is integrated within the component carrier.

As phase change materials perform best in small containers, therefore they can be divided and encapsulated in cells or cavities within a matrix material carrier. The cells can be shallow to reduce static head. The matrix material should conduct heat well; and it should be durable enough to withstand frequent changes in the stored phase-change material's volume as phase changes occur. It should also restrict the passage of water through the walls, so the materials will not dry out, or, respectively, water-out, if the material is hygroscopic. The matrix material carrier must also resist leakage and corrosion. Common matrix materials showing chemical compatibility with room temperature PCMs include for example stainless steel and plastic materials like polypropylene.

In a further practical embodiment of the component carrier, the matrix material carrier can be made of a metal matrix composite material.

Thermal conductivity is a common property, which is targeted for maximization by creating thermal composites. The aim of such composite materials is to increase thermal conductivity by adding a highly conducting solid metal like a copper-mesh into a relatively low conducting phase-change material like a paraffin wax thus increasing overall or bulk thermal conductivity. If the PCM is required to flow, the solid must be porous, such as a mesh.

Advantageously the component carrier according to the invention can comprise a matrix material carrier that is made of a woven matrix composite material.

Solid composites like fibre-glass or Kevlar-pre-preg usually refer to a woven fibre—like Kevlar or glass—embedded in a matrix when the glue solidifies to hold fibres and provides compressive strength.

In an appropriate implementation of the invention the component carrier can comprise at least one energy-harvesting element, wherein the energy-harvesting element contains phase-change material that is directly thermoconductively coupled with the at least one heat-passage component.

In a further development of the invention, the component carrier can comprise an energy-harvesting element that is a thermoelectric cooler or a thermoelectric generator.

Thermoelectric cooling uses the Peltier-Seebeck effect to create a heat flux through the interface of two different types of materials. While the Peltier effect relates to the presence of heating or cooling at an electrified junction of two different conductors, the Seebeck effect concerns the conversion of heat directly into electricity at the different metal/metal junctions.

A Peltier cooler, heater, or thermoelectric heat pump is a solid-state active heat pump which transfers heat from one side of the device to the other, with consumption of electrical energy, depending on the direction of the current. Such an instrument is also called a Peltier device, Peltier heat pump, solid state refrigerator, or thermoelectric cooler (TEC). It can be used either for heating or for cooling, although in practice the main application is cooling. The primary advantages of a Peltier cooler are its lack of moving parts or circulating liquid, very long life, invulnerability to leaks, small size and flexible shape.

A Peltier cooler can also be used as a thermoelectric generator. When operated as a cooler, a voltage is applied across the device, and as a result, a difference in temperature will build up between the two sides. When operated as a generator, one side of the device is heated to a temperature greater than the other side, and as a result, a difference in voltage will build up between the two sides. Thus, a thermoelectric generator converts heat or temperature differences, respectively, directly into electrical energy.

In another preferred modification of the invention, the component carrier comprises phase-change material that can be in direct contact with the at least one heat-passage component.

In this embodiment, the PCM is directly attached to the respective heat-passage component. Thus, thermal conductivity is further enhanced.

The objects of the current invention are also solved by providing a production method for a component carrier with the features described herein.

A method for producing said component carrier, realized as a printed circuit board, an intermediate printed circuit board product or an IC-substrate, with at least one heat-passage component being realized in form of a heat-generating or a heat-absorbing component, and at least one latent-heat storage unit with a phase-change material, comprises the following sequence of steps:

a. Providing a phase-change material;
b. Optionally arranging the phase-change material as a latent-heat storage unit and/or embedding the phase-change material into a matrix material carrier;
c. Providing at least one layer of the component carrier, preferably at least one inner layer;
d. Optionally manufacturing at least one cavity in said at least one layer; and either
e. Embedding the phase-change material, which phase-change material is optionally already embedded within a matrix material carrier, within said at least one cavity of said at least one layer of the component carrier; or
f. Arranging the phase-change material sectionally upon at least one section of a surface area of the at least one layer of the component carrier; and additionally
g. Optionally embedding at least one heat-passage component within at least one layer of the component carrier or within the phase-change material;
h. Arranging one or more further layers on the outsides of the at least one layer in a way to cover and surround the phase-change material;
i. Laminating the layers together with the phase-change material to receive a first intermediate product;
j. Optionally mounting at least one heat-passage component on an outside surface layer;
k. Thermoconductively coupling of the phase-change material with the at least one heat-passage component.

With this production method, a flexible guidance how to produce different embodiments of a component carrier with at least one heat-passage component and at least one latent-heat storage unit with a phase-change material is provided.

According to step -e- in a first option of the inventive method the phase-change material can be embedded within at least one cavity of one or several layers of the component carrier. Depending on the type of PCM used, the phase-change material can also be applied as already embedded or encapsulated PCM within a matrix material carrier, before it is afterwards embedded within one or several cavities of the component carrier.

According to production step -f- which is an alternative step to aforesaid step -e- and which is a second option of the inventive production method, the phase-change material can be arranged sectionally upon at least one section of a surface area of the at least one layer of the component carrier.

Advantageously the phase-change material is positioned locally next to a position of a heat-passage component in a way that direct thermoconductive coupling between the phase-change material and the heat-passage component is ensured. This can either be done via production step -e- where the phase-change material is embedded within at least one cavity that is positioned next to the position of the heat-passage component. Alternatively, in an alternative embodiment of the production method according to production step -f-, the phase-change material is arranged on a surface area section of a layer which area section is positioned next to the position of the heat-passage component. Thus, the amount of phase-change material applied can be reduced, production costs can be reduced and the efficiency of the component carrier can be enhanced as the phase-change material is positioned right there where required in direct contact to the heat-passage components. In addition, flexibility of the component carrier is enhanced as the phase-change material is applied only locally in a cavity or upon a defined surface area section of a layer. Advantageously there are regions left within the component carrier's design without phase-change material being applied. In these regions without PCM, for example through-holes can be drilled without damage to the integrated phase-change material.

In a preferred embodiment the region with integrated PCM equals in its areal extent the size of the surface area of the heat-generating component to be thermoconductively coupled. Depending on the individual applications, in another preferred embodiments the areal extent of the locally arranged PCM material can also correspond for example with a multiple size, like double or triple size, of the surface area of the respective heat-generating component.

According to the optional step -g- at least one heat-passage component can be embedded within at least one layer of the component carrier or can be embedded within the phase-change material. This heat-passage component can be for example an electronic component that generates heat during operation.

According to production step -h-, one or more further layers are arranged on the outsides of the at least one layer in a way to cover and surround the phase-change material. In case that production step -e- has been applied, the PCM is yet embedded within at least one cavity that is formed within one or several layers of the component carrier. This at least one layer will already surround the PCM. Thus, only at least one cover layer has to be arranged on top of the cavity to close the cavity with the embedded phase-change material. Alternatively, in case that production step -f- has been applied, preferably several further layers have to arranged firstly to surround the phase-change material and secondly to cover it afterwards.

Thus, the one or several layers are arranged in a way around the phase-change material that the PCM is surrounded and encased by the layers to position the PCM for the subsequent lamination step -i-.

In production step -i- the layers are laminated together with the phase-change material to receive a first intermediate product. As aforesaid, via lamination the phase-change material is integrated within at least one cavity of the component carrier. Advantageously via lamination, also unwanted air bubbles can be avoided within the cavity that is filled with the PCM.

Alternatively, or additionally to production step -g-, in optional step -j- at least one heat-passage component can be mounted on an outside surface layer of the component carrier. In case the heat-passage component is surface-mounted on an outside surface layer, it may for example be carried out as one component or structure that collects and absorbs energy from the environment.

According to a particularly efficient embodiment of the inventive method to produce a component carrier, the phase-change material can be directly thermoconductively coupled with the at least one heat-passage component by means of at least one thermal via, plated through-hole and/or heat pipe.

Advantageously within the method for producing a component carrier the phase-change material can be arranged sectionally upon at least one section of a surface area of the at least one layer of the component carrier via a printing process and/or a silk-screen process and/or can be applied embedded within a layer of a woven matrix composite material. As said before, the phase-change material preferably is arranged in those area sections only where a heat-passage component is positioned afterwards.

In a further development of the invention, the method for producing a component carrier can comprise phase-change material that is embedded into a matrix material carrier, preferably embedded into a matrix material carrier made of a metal matrix composite material and/or a woven matrix composite material.

Particularly practical, the inventive method for producing a component carrier can be applied to phase-change material that is microencapsulated and/or is a solid-solid phase-change material.

In another embodiment of the invention the method for producing a component carrier can comprise at least one energy-harvesting element that is integrated within the component carrier wherein the at least one energy-harvesting element contains phase-change material that is directly thermoconductively coupled with the at least one heat-passage component.

The aforesaid advantages of a component carrier apply equivalently also for a method for producing such a component carrier according to the invention FIG. 1 shows in a diagram as a function of energy input in Joule [J] versus temperature in Kelvin [K] the phase changes of melting and vaporisation of a phase-change material. Between points marked with "A" and "B" the phase-change material is in solid state. Between points marked with "B" and "C", the phase-change material melts and during this phase change can absorb and store a certain energy input while temperature of the phase-change material stays more or less constant. When energy input is further enhanced, temperature of the liquid phase-change material increases until point "D" is reached when vaporisation begins. Between points "D" and "E" the phase-change material vaporizes and during this further phase change can again absorb and store a certain energy input while temperature of the phase-change material stays more or less constant. When the energy input further continues, temperature of the gaseous the phase-change material will further rise until point "F" is reached.

The aforesaid properties of PCMs, namely the ability to store latent heat as a heat reservoir for a limited time when a device mounted on it works at peak performance and generates off-heat, can be used for a component carrier according to the present invention. The phase changing temperature—for example the melting temperature—of the PCM can be engineered according to the specific working temperatures of a component carrier.

Figure 2A:
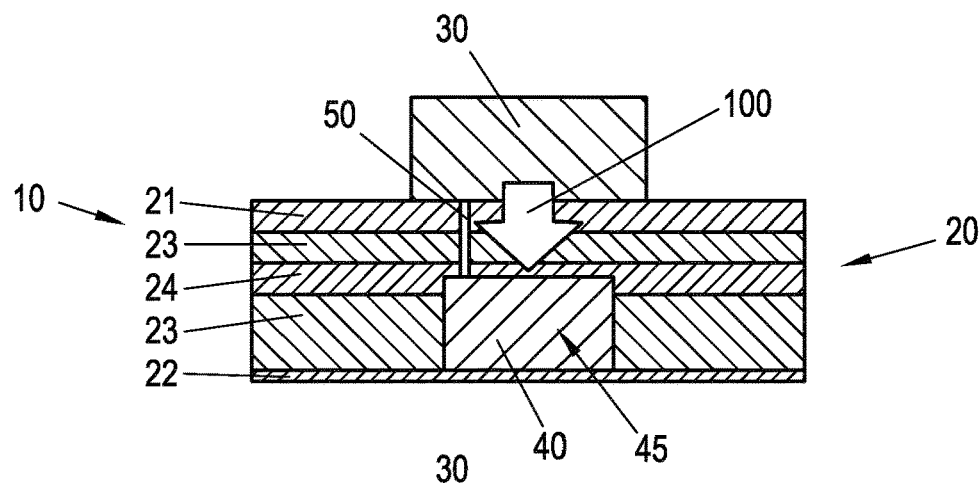
FIGS. 2A to 2C each show in cross-sectional side views the basic principle of a phase-change material during a duty cycle.
Figure 2B:
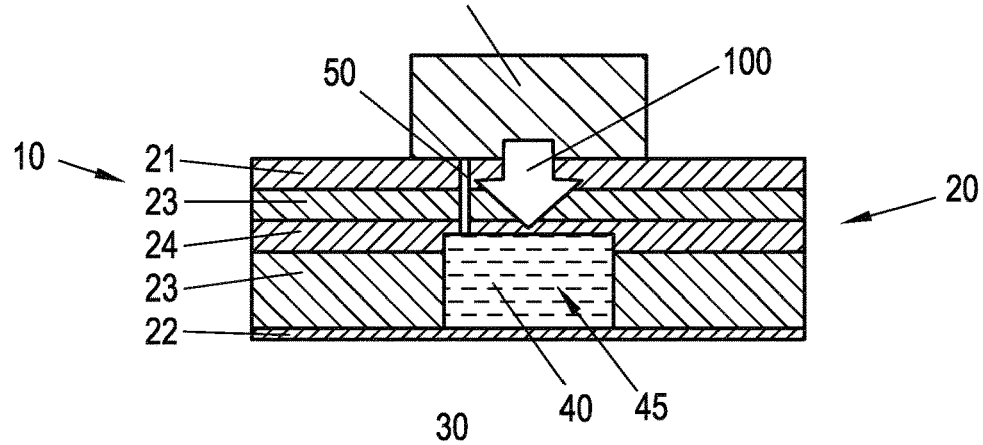
Figure 2C:
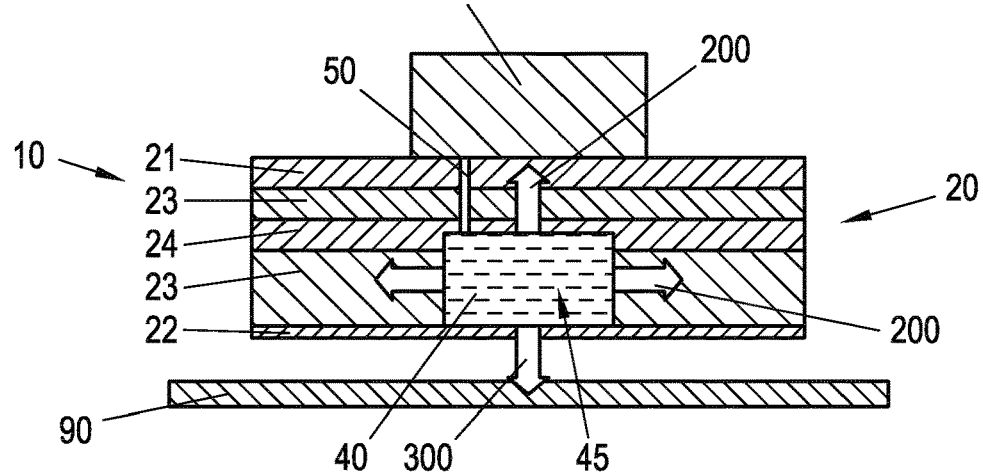

FIG. 2A to FIG. 2C each show in cross-sectional side views the basic principle of a phase-change material during a duty cycle.

FIG. 2A depicts a component carrier 10, for example, a printed circuit board or an intermediate PCB product. The component carrier 10 comprises several layers 20, for example a first, upper outside surface layer 21, a second, lower outside surface layer 22, first inner layers 23 as well as a second inner layer 24 of the component carrier 10. At least one heat-passage component 30 is mounted on an outside surface layer 21, 22 or can be embedded within at least one inner layer 23, 24 of the component carrier 10. The component carrier 10 further comprises at least one latent-heat storage unit 40 with a phase-change material 45, wherein the phase-change material 45 is integrated within a cavity of the component carrier 10 and is directly thermoconductively coupled with the at least one heat-passage component 30 with at least one thermal via 50. The heat-passage component 30 produces off-heat during operation which is symbolized as heat input 100 arrow and which is conducted into the printed circuit board by means of direct thermoconductive coupling provided by a thermal via 50 that contacts the heat-passage component 30 as well as the PCM 45.

Due to the heat input 100 the phase-change material 45 for example melts and during this melting phase change can absorb and store a certain energy input while temperature of the phase-change material 45 stays more or less constant. Thus, also temperature of the heat-passage component 30 advantageously does not change or changes very little due to the internal heat resistance of the PCM 45, which is assumed to be very low. This status pertains as long as the phase-change material 45 can absorb excess heat 100.

As shown in FIG. 2B phase change of the phase-change material 45 is complete and PCM 45 is liquefied. While heat input 100 is further enhanced, temperature of the liquid phase-change material 45 increases. In addition, temperature of the heat-passage component 30 increases as cooling capacity or heat storage capacity, respectively, of the phase-change material 45 is exhausted. For example, the heat-passage component 30 or a device containing said heat-passage component 30 must then be turned off or continue its duty at lower performance to avoid thermal break-down.

In FIG. 2C, the phase-change material 45 is shown during its regeneration cycle while heat is released into the environment. This heat dissipation is indicated via a heat conduct 200 arrow that shows the heat conduct 200 flow into the printed circuit board. A heat output 300 arrow indicates the heat output 300 flow through a casing 90 of an electronic device into the surroundings of the respective electronic device. The heat-passage component 30 will absorb only a small share of the released off-heat 200, 300, as the phase-change material 45 is also in contact with other parts or layers 20 of the printed circuit board. Thus, the increase of temperature of the heat-passage component 30 due to heat conduct 200 or heat output 300 flow is expected to be little.

Figure 3:
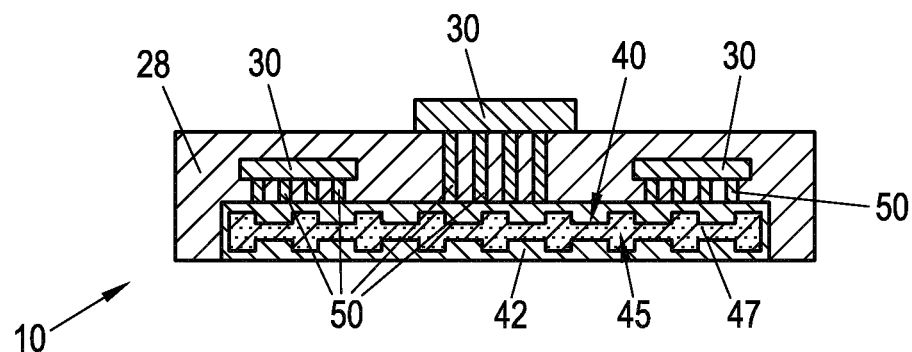
FIG. 3 depicts in a cross-sectional side view a first embodiment of a component carrier according to the invention.

FIG. 3 depicts in a cross-sectional side view a detail of a first embodiment of a component carrier 10 according to the invention. Here a possible printed circuit board build-up is shown with a latent-heat storage unit 40 comprising a phase-change material 45. Here a copper structure is built as cooling body 42 to enclose the phase-change material 45, which is for example microencapsulated phase-change material 47. The cooling body 42 is designed as heat-exchanger with an enlarged inner surface. The latent-heat storage unit 40 with its copper structure 42 is directly connected with several thermal vias 50 to hot-spots of heat-passage components 30 that are embedded within not explicitly shown layers 20 like outside surface layers 21, 22 and inner layers 23, 24 of the component carrier 10. Depending on the layer design, there may be layers 20 made of conducting material and also layers 20 made of insulating pre-preg material 28. Another heat-passage component 30 is surface-mounted on top of the printed circuit board and again is thermoconductively coupled with thermal vias 50 to the latent-heat storage unit 40 filled with microencapsulated phase-change material 47.

Figure 4:
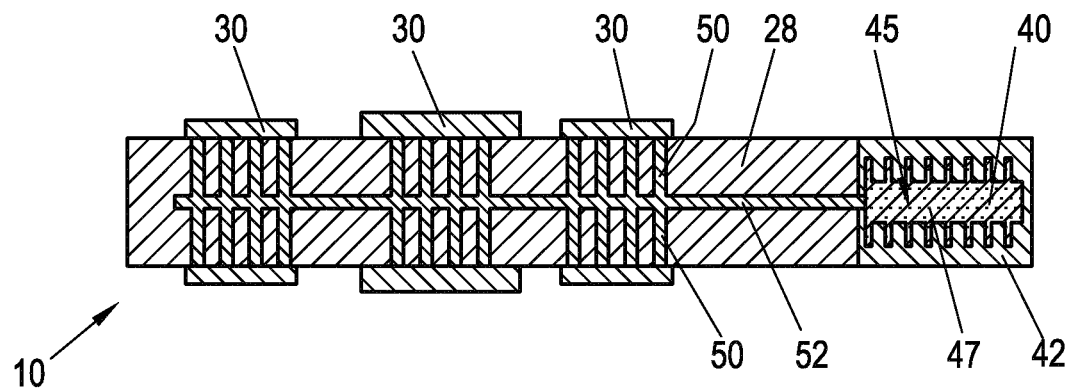
FIG. 4 shows in a cross-sectional side view a second embodiment of a component carrier according to the invention.

FIG. 4 shows in a cross-sectional side view a detail of a second embodiment of a component carrier 10 according to the invention. Here within an intermediate printed circuit board product the hot-spots of the heat-passage components 30 are thermally connected via thermal vias 50 to a central heat pipe 52. The heat pipe 52 however is directly connected to a latent-heat storage unit 40 that has a cooling body 42 made of a copper structure and is filled with phase-change material 45 which is here microencapsulated phase-change material 47. The cooling body 42 is designed as heat-exchanger with an enlarged inner surface to enhance the heat conduct of the stored latent heat to quickly reverse the phase-change process and to reduce temperature of the phase-change material 47.

Figure 5:
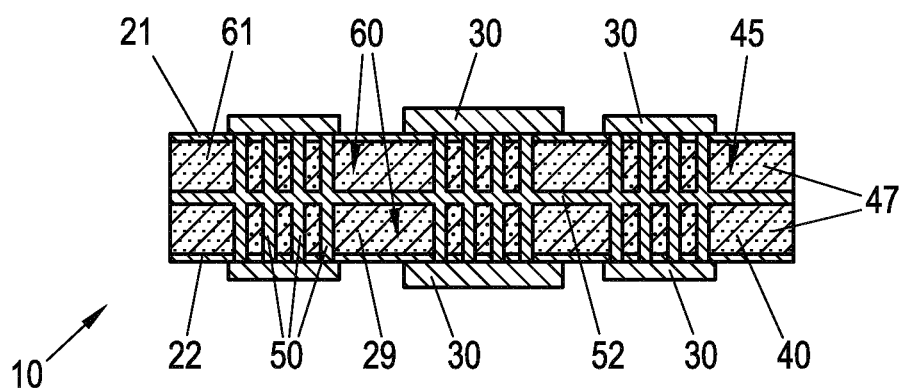
FIG. 5 depicts in a cross-sectional side view a third embodiment of a component carrier according to the invention.

FIG. 5 depicts in a cross-sectional side view a detail of a third embodiment of a component carrier 10 according to the invention. Here the heat-passage components 30 are surface-mounted on an intermediate printed circuit board product, which comprises a matrix material carrier 60 as latent-heat storage unit 40 made of a foam material 29. The phase-change material 45 which is here microencapsulated phase-change material 47 is arranged within the cavities 61 of the matrix material carrier 60. Hot-spots of the heat-passage components 30 are thermally connected via thermal vias 50 to a central heat pipe 52 that runs through the matrix material carrier 60 filled with PCM 45.

Figure 6:
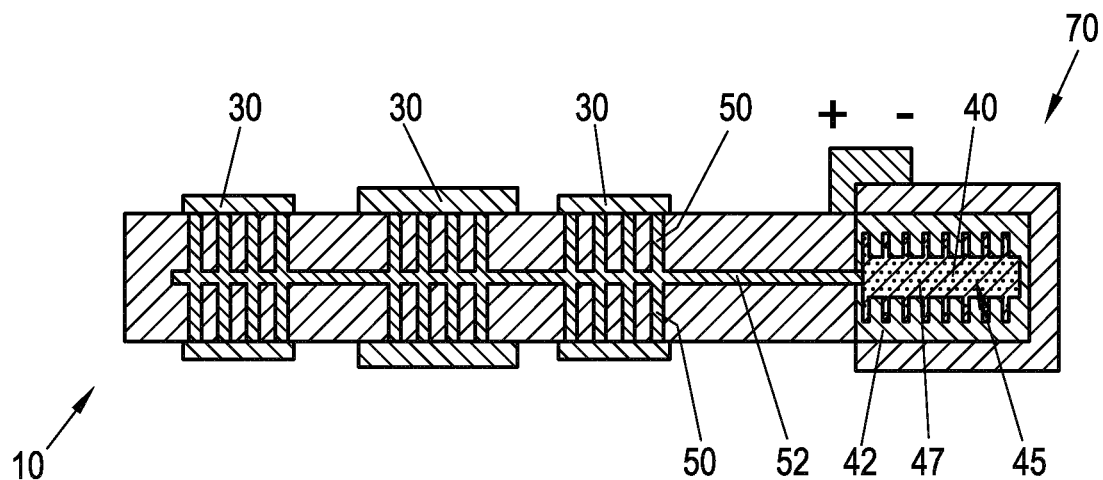
FIG. 6 shows in a cross-sectional side view a fourth embodiment of a component carrier according to the invention.

FIG. 6 shows in a cross-sectional side view a detail of a fourth embodiment of a component carrier 10 according to the invention. As mentioned previously PCM materials 45 can also be used to collect energy from systems throughout the component carrier 10 like a PCB for energy harvesting purposes. Here one possibility is shown to use a PCM 45 heat reservoir to collect waste energy to be converted via an energy-harvesting element 70 like a Peltier element that is installed within the component carrier. The energy-harvesting element 70 is thermoconductively coupled via a heat pipe 52 and several thermal vias 50 with the heat-passage components 30 that can be hot-spots during peak-performance of the component carrier 10. The depicted heat-passage components 30 are here in terms of heat-balances "active" heat-generating components that generate waste-heat themselves.

Figure 7:
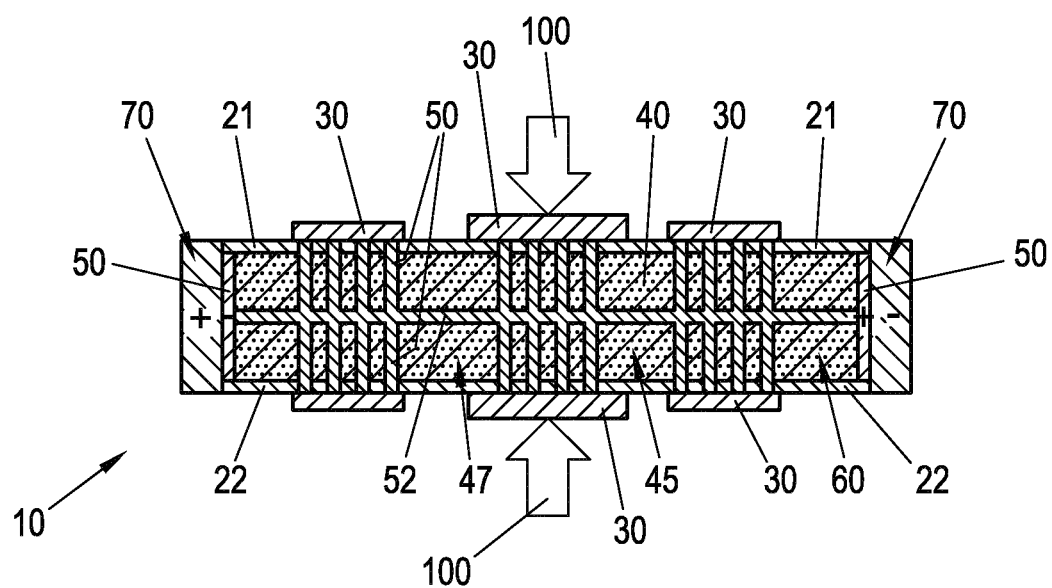
FIG. 7 illustrates in a cross-sectional side view a fifth embodiment of a component carrier according to the invention.

FIG. 7 illustrates in a cross-sectional side view a detail of a fifth embodiment of a component carrier 10 according to the invention. Here energy collection from the environment is symbolized via a heat input 100 arrow. This heat input 100 can result for example from off-heat of a light or an engine like in automotive applications where PCB's or component carriers 10 in general may be placed close to hot-spots within the vehicle. Here the heat-passage components 30 may be "passive" heat-absorbing components or structures, respectively, whereby the "passive" heat-passage components 30 collect and absorb energy from the environment. The both energy-harvesting elements 70 are each thermoconductively coupled via heat pipes 52 and several thermal vias 50 with the respective heat-passage components 30 of the component carrier 10.

FIG. 8A to FIG. 8C each refer in partially cross-sectional side views to details of a first method to produce a multi-layer component carrier 10 with embedded phase-change material 45.

FIG. 8A shows a latent-heat storage unit 40 with a cooling body 42 made of copper that is filled with phase-change material 45. The phase-change material 45 is for example microencapsulated phase-change material 47 that is arranged within the cavities 66 of a metal matrix composite material 65.

FIG. 8B depicts an inner layer 23 of the component carrier 10 that has a cavity 25 and is made of a pre-preg material 28. The size of the latent-heat storage unit 40 with the cooling body 42 as shown in FIG. 8A matches the size of the cavity 25. Thus, the surface area 27 of the inner layer 23 is continued when the cooling body 42 is inserted into the cavity 25. Or in other words the cooling body 42 of the latent-heat storage unit 40 is dimensioned in such a manner that its outer surface extends the surface area 27 of the inner layer when inserted into the cavity 25 of said layer 23.

FIG. 8C shows the latent-heat storage unit 40 being embedded within the cavity 25 of the inner layer 23 of the component carrier 10. Attached to the inner layer 23 are a first, upper outside surface layer 21 and a second, lower outside surface layer 22. The layers 20 are here made of pre-preg material 28. On a section of the upper outside surface layer 21 a metal plating layer 55 is arranged which forms a base for the heat-passage component 30 that may be here in terms of heat-balances an "active" heat-generating component or a hot spot, respectively. The heat-passage component 30 is thermoconductively coupled via the metal plating layer 55 made of copper and further on by means of several thermal vias 50 to the latent-heat storage unit 40 that is filled with PCM 45. Optionally also here further layers 20 can be added on one outer side or on both outer sides of the component carrier 10. Thus the heat-passage component 30 can be either surface-mounted or also embedded within one or several further layers 20.

Figure 9A:
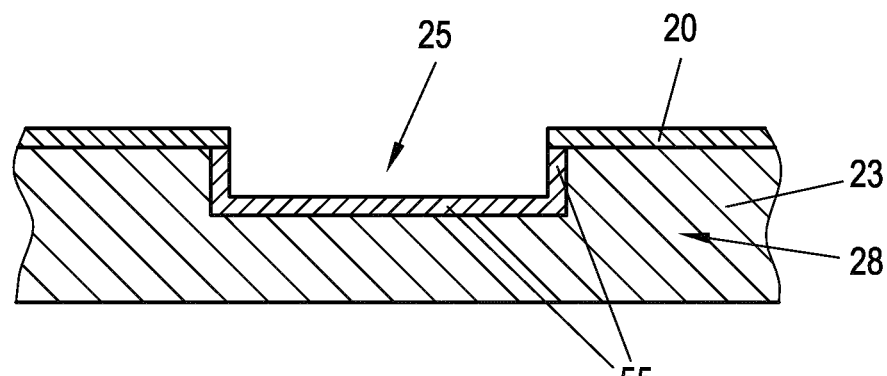
FIGS. 9A to 9C show in cross-sectional side views a second method to produce a multi-layer component carrier with embedded phase-change material.
Figure 9B:
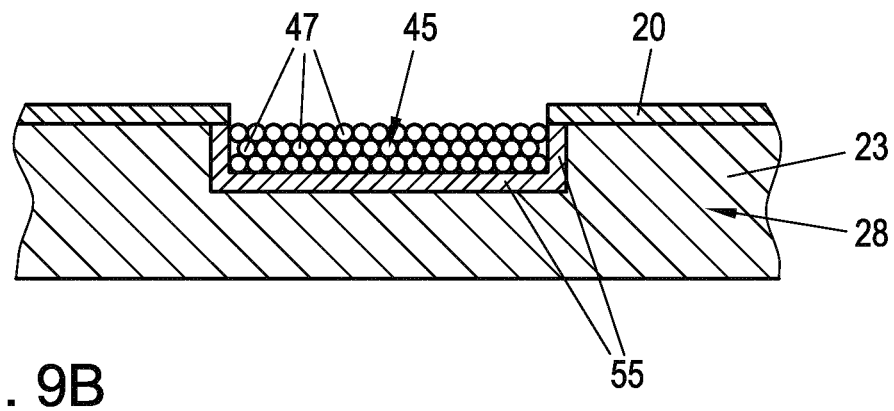
Figure 9C:
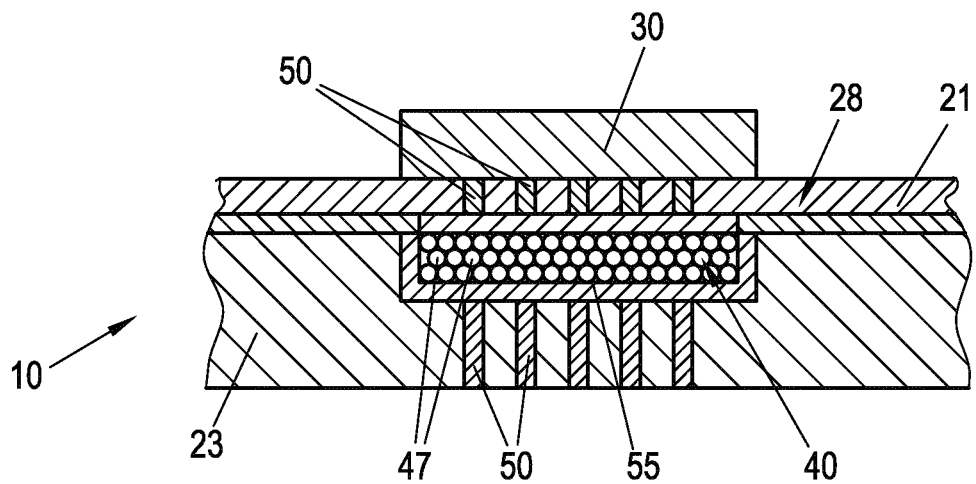

FIG. 9A to FIG. 9C show in cross-sectional side views details of a second method to produce a multi-layer component carrier 10 with embedded phase-change material 45.

In FIG. 9A, an inner layer 23 of the component carrier 10 is shown that has a cavity 25 and is made of a pre-preg material 28. On the upper side of the inner layer 23 a further layer 20 is attached that is here for example a copper layer 20. The cavity 25 is on its inner walls coated with copper forming a metal plating layer 55. The cavity 25 is manufactured for example via so-called 2.5D technology developed by the applicant.

FIG. 9B shows the cavity 25 as depicted in FIG. 9A already filled with a slurry of PCM 45 wherein the phase-change material 45 is provided for example as microencapsulated phase-change material 47.

FIG. 9C shows in a next, subsequent manufacturing step in regard to FIG. 9B the filled cavity 25 in an already closed arrangement wherein the metal plating layer 55 that surrounds the microencapsulated phase-change material 47 together with a copper layer 20 atop of the phase-change material 45 form a latent-heat storage unit 40. On the upper side of the inner layer 23 and copper layer 20, respectively, an upper outside surface layer 21 of the component carrier 10 is arranged. On top of this outside surface layer 21 a heat-passage component 30 is thermoconductively coupled by means of thermal vias 50 with the latent-heat storage unit 40 and the PCM 45 filled inside. On the opposite side of the heat storage unit 40 also several thermal vias 50 are arranged that connect the metal plating layer 50 with the lower outside of the inner layer 23 to be either connected with one or more further heat-passage components that are not depicted or to be connected with further layers.

FIG. 10A and FIG. 10B show in partially cross-sectional side views details of different methods how to produce intermediates of a component carrier 10 with integrated phase-change material 45.

FIG. 10A refers to a method whereby PCM material here for example microencapsulated phase-change material 47 is inserted via an injection device 80 into cavities of a matrix material carrier 60 made of foam material 29 that can be processed further to turn into a printed circuit board according to the invention.

FIG. 10B shows a method to insert a phase-change material slurry 48 via an injection device 80 into a matrix material carrier 60 made of a foam material 29. Also in this embodiment the foam material 29 has to be processed further to turn into a PCB material. Also the PCM slurry 48 must be cured after insertion before the PCB material can be further processed. Afterwards if necessary for example further layers 55, thermal vias 50 or plated through holes 51 can be arranged before heat-passage components 30 can be thermoconductively coupled thereto.

FIG. 11A and FIG. 11B each show in cross-sectional side views details of method steps how to produce a component carrier 10 with printed phase-change material 45.

In FIG. 11A encapsulated phase-change material slurry 49 is printed by means of a printing head 85 on outside surface sections of a layer 20, for example a pre-preg material 28 layer. Preferably the structures of encapsulated phase-change material slurry 49 have to be hardened after printing by means of a drying process at higher temperatures. Instead of printing the encapsulated phase-change material slurry 49 with a printing head it can also be applied and structured by means of silkscreen printing.

FIG. 11B shows the arrangement of FIG. 11A in a subsequent process step after lamination of a further pre-preg material 28 layer atop of the printed phase-change material 45. Thus the printed structures of phase-change material slurry 49 are embedded between the two pre-preg 28 layers. Afterwards one or more heat-passage components 30 can be arranged on the outside surfaces of the layers 28 and can be thermoconductively coupled by means of thermal vias 50 with the embedded PCM 45. The intermediate as shown in FIG. 11B can afterwards be further processed for example by attaching further layers to receive a printed circuit board.

Figure 12A:
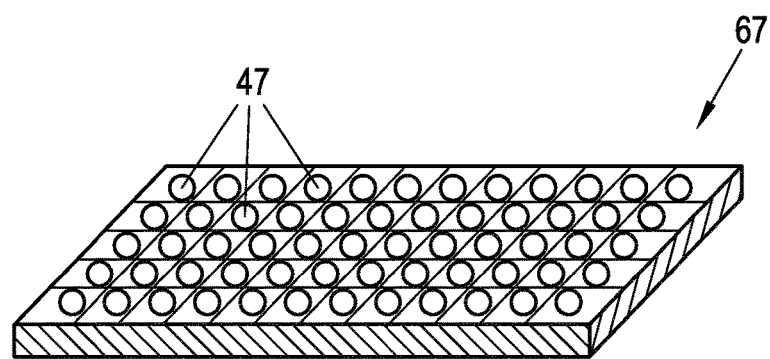
FIGS. 12A and 12B show in a detailed view stage wise steps of a method to produce an intermediate of a component carrier with phase-change material integrated in a woven matrix material.
Figure 12B:
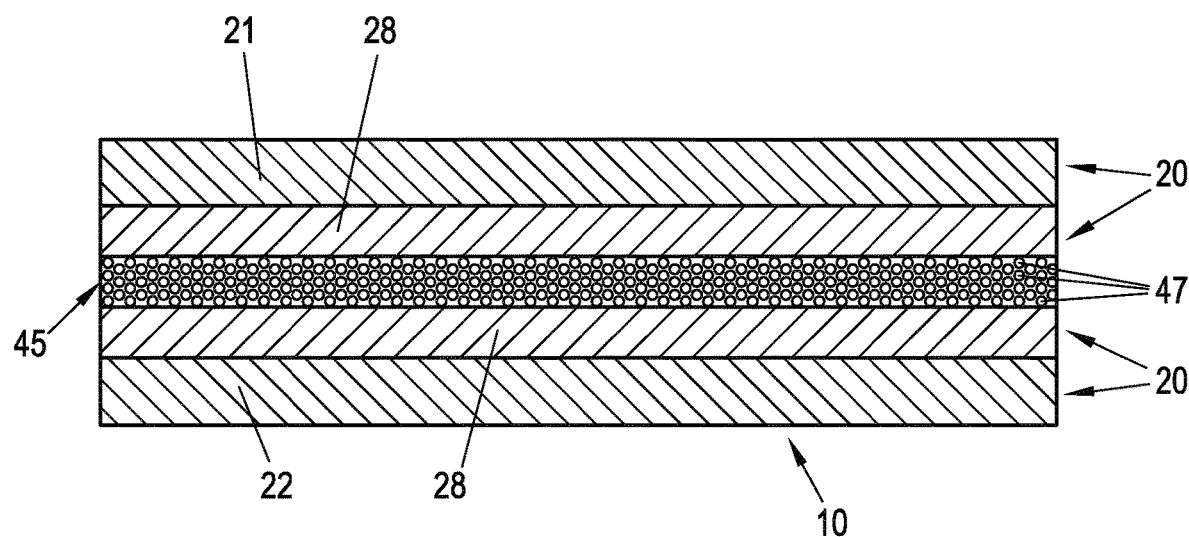

FIG. 12A and FIG. 12B show in detailed views stage wise a method how to produce an intermediate of a component carrier 10 with phase-change material 45 that is integrated in a woven matrix material 67. The woven matrix material 67 can be made for example of glass fibres.

In FIG. 12A a detail of the woven matrix material 67 with embedded PCM 45 in form of microencapsulated phase-change material 47 is shown in an isometric view.

FIG. 12B refers to the detail of the woven matrix material 67 as shown in FIG. 12A that is depicted as a detail of a sectional side view embedded within layers 20 forming the basis of an intermediate printed circuit board product according to the invention. The inner layers 20 can be made for example of pre-preg material 28. Further on one or more heat-passage components 30 that are not shown for clarity reasons can be mounted on an outside surface layer 21, 22 or can be embedded within the layers 20 and be directly thermoconductively coupled with the at least one heat-passage component 30 to receive a component carrier 10.

Figure 13A:
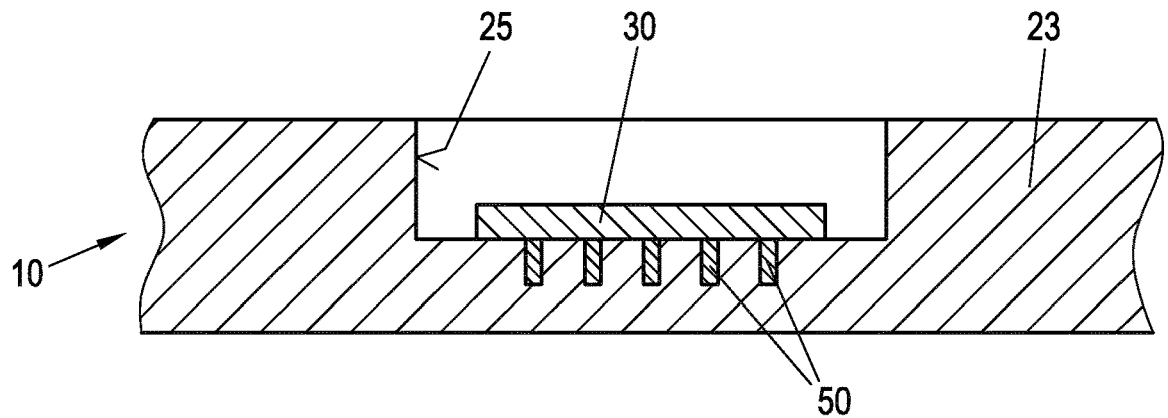
FIGS. 13A to 13C each show in cross-sectional side views a method to produce an intermediate of a component carrier with phase-change material in direct contact with an embedded heat-passage component
Figure 13B:
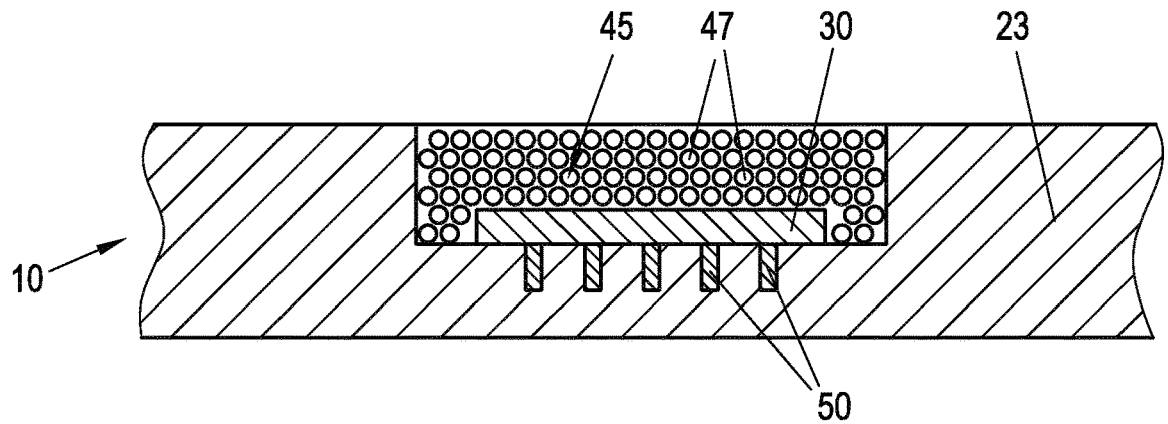
Figure 13C:
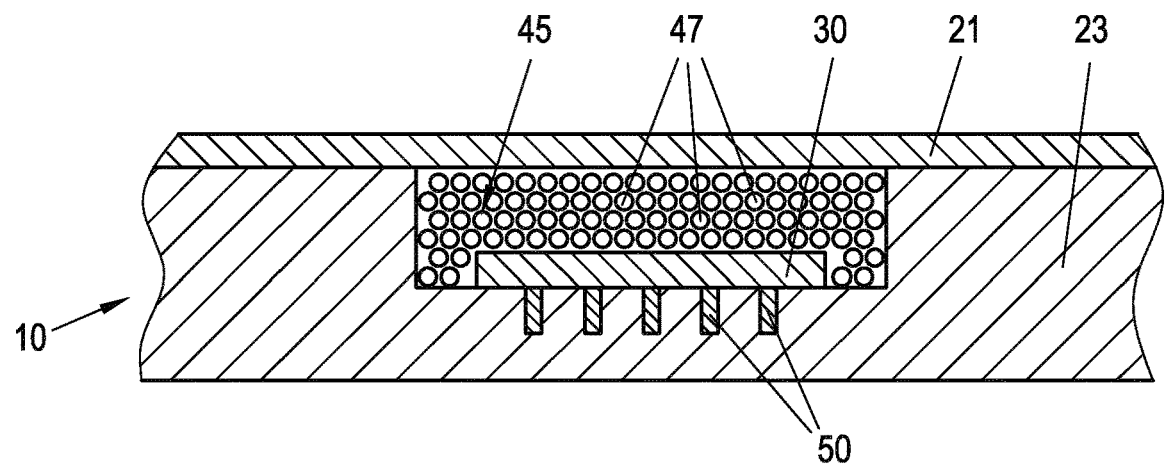

FIG. 13A to FIG. 13C each show in cross-sectional side views a method to produce an intermediate printed circuit board product of a component carrier with phase-change material in direct contact with an embedded heat-dissipating heat-passage component.

FIG. 13A refers to an inner layer 23 of the component carrier 10 that has a cavity 25. The cavity 25 is manufactured for example by means of the 2.5D technology developed by the applicant. On the bottom of the cavity 25 a heat-passage component 30 is attached to the inner layer 23 and thermoconductively connected thereto by means of thermal vias 50.

FIG. 13B shows the cavity 25 as depicted in FIG. 13A already filled with a slurry of PCM 45 wherein the phase-change material 45 is provided for example as microencapsulated phase-change material 47. The embedded heat-passage component 30 is covered by the PCM 45 which directly contacts the upper surface of the heat-passage component 30.

FIG. 13C shows in a next, subsequent manufacturing step in regard to FIG. 13B the filled cavity 25 in an already closed arrangement wherein a further upper outside surface layer 21 is positioned atop of the phase-change material 45 to close the cavity 25. Thus an embedded latent-heat storage unit 40 is formed. The thermal vias 50 that now end within the inner layer 23 of the intermediate printed circuit board product can be further connected to a not shown heat-passage component 30 that can be in terms of heat-balances quasi an "active" heat-generating or a "passive" heat-absorbing component or structure, respectively, whereby an "active" heat-passage component might be one that itself generates waste-heat whereas a "passive" heat-passage component might be one that collects and absorbs energy from the environment. The thermal vias 50 may also be connected to a cooling device that is mounted on the outside of the intermediate printed circuit board product and enhances the heat output into the surroundings of the component carrier.

DOCTRINE OF EQUIVALENTS

As can be inferred from the above discussion, the above-mentioned concepts can be implemented in a variety of arrangements in accordance with embodiments of the invention.

Accordingly, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

The invention claimed is:

1. A component carrier, realized as a printed circuit board, an intermediate printed circuit board product or an IC-substrate, comprising:
   at least one heat-passage component, said at least one heat-passage component further comprising a heat-generating or a heat-absorbing component that is mounted on an outside surface layer or is embedded within at least one inner layer of the component carrier, and
   at least one latent-heat storage unit separated from the at least one heat-passage component and further comprising a phase-change material wherein the latent-heat storage unit is arranged within at least one cavity and integrated within a laminated build-up of the component carrier and wherein the phase change material is directly thermoconductively coupled with the at least one heat-passage component.

2. The component carrier of claim 1, wherein the phase-change material is thermoconductively coupled with the at least one heat-passage component by a means selected from a group consisting of at least one thermal via, plated through-hole, and a heat pipe.

3. The component carrier of claim 1 wherein the phase-change material is a microencapsulated phase-change material, having a mean particle size of 1 µm to 50 µm.

4. The component carrier of claim 1, wherein the phase-change material is encapsulated within cavities of a matrix material carrier that is integrated within the component carrier.

5. The component carrier of claim 4, wherein the matrix material carrier is made of a metal matrix composite material.

6. The component carrier of claim 4, wherein the matrix material carrier is made of a woven matrix composite material.

7. The component carrier of claim 1, further comprising at least one energy-harvesting element, characterized in that the at least one energy-harvesting element contains phase-change material that is directly thermoconductively coupled with the at least one heat-passage component.

8. The component carrier of claim 7, wherein the at least one energy-harvesting element is a thermoelectric cooler or a thermoelectric generator.

9. The component carrier of claim 1, wherein the phase-change material is in direct contact with the at least one heat-passage component.

10. The component carrier of claim 1 wherein the phase-change material is selected from a group consisting of a microencapsulated phase-change material and a solid-solid phase change material, wherein the phase-change material has a mean particle size of 5 µm to 30 µm.

\* \* \* \* \*